United States Patent [19]

Mahmoud

[11] Patent Number: 4,954,370

[45] Date of Patent: Sep. 4, 1990

[54] ELECTROLESS PLATING OF NICKEL ON ANODIZED ALUMINUM

[75] Inventor: Issa S. Mahmoud, Austin, Tex.

[73] Assignee: International Business Machines Corporation, Armonk, N.Y.

[21] Appl. No.: 289,994

[22] Filed: Dec. 21, 1988

[51] Int. Cl.$^5$ .............................................. C23C 26/00
[52] U.S. Cl. .................................. 427/438; 427/304; 427/305; 427/306
[58] Field of Search ............... 427/438, 304, 305, 306; 106/1.27

[56] References Cited

U.S. PATENT DOCUMENTS

| | | | |
|---|---|---|---|
| 3,154,478 | 10/1964 | Lee | 106/1.27 |
| 3,666,529 | 5/1972 | Wright | 427/438 |
| 3,726,771 | 4/1973 | Coll-Palagos | 427/438 |
| 3,782,978 | 1/1974 | Souza | 106/1.27 |
| 3,993,801 | 11/1976 | Feldstein | 427/305 |
| 4,021,592 | 5/1977 | Fromson | 427/305 |
| 4,038,085 | 7/1977 | Scannell | 427/438 |
| 4,122,215 | 10/1978 | Vratny | 427/438 |
| 4,181,760 | 1/1980 | Feldstein | 427/438 |
| 4,196,061 | 4/1980 | Satee | 106/1.27 |
| 4,232,060 | 11/1980 | Mallory | 427/305 |
| 4,305,997 | 12/1981 | Feldstein | 427/305 |
| 4,400,415 | 8/1983 | Kessler | 427/438 |
| 4,431,707 | 2/1984 | Burns et al. | 428/629 |
| 4,600,609 | 7/1986 | Leever | 427/443.1 |
| 4,840,820 | 6/1989 | Schultz | 427/305 |

OTHER PUBLICATIONS

Malathy Pushpavanam et al., "Electroless Nickel—A Versatile Coating", Finishing Industries, Jun. 1977, pp. 48–52, 58.

Donald W. Bandrand, "Autocatalytic (Electroless) Plating on Aluminum", Plating and Surface Finishing, Dec. 1979, pp. 14–17.

*Primary Examiner*—Shrive Beck
*Assistant Examiner*—Vi Duong Dang
*Attorney, Agent, or Firm*—Andrea P. Bryant

[57] ABSTRACT

A novel electroless plating bath composition and method for the use thereof, are described for depositing a layer of nickel on anodized aluminum substrates for facilitating direct attachment of electronic chips thereto; the bath composition being a neutralized solution of nickel sulfate, sodium citrate, lactic acid and dimethylbomine in deionized water.

5 Claims, No Drawings

ELECTROLESS PLATING OF NICKEL ON ANODIZED ALUMINUM

BACKGROUND OF THE INVENTION

1. Field of the Invention

The invention relates to electronic packaging, more specifically it relates to a method of electrolessly plating nickel on an anodized aluminum substrate with subsequent direct attachment of chips thereto.

2. Description of the Prior Art

Commonly assigned U.S. Pat. No. 4,431,707 relates to plating anodized aluminum substrates, in particular a method of preparing aluminum substrates for utilization as printed circuit boards.

A number of electroless plating formulations are commercially available. These formulations are diverse in their chemical compositions, reactivity, and operating conditions. Most, however, require high operating temperatures and are either acid based, having a pH in the range of 1-4, or alkaline based, with a pH in the range of 10-13. Either of these conditions are detrimental to an anodic coating on aluminum because they either react with and/or solubilize the surface layer.

As a result of these detrimental effects, problems may arise such as unsatisfactory adhesion characteristics, anodic coating thinning to the point where its voltage breakdown is compromised and, in the case of additive plating, plating over the entire surface, which causes shorts and renders the coating unacceptable for packaging applications.

Anodized aluminum substrates have excellent thermal dissipation capabilities, may have a built-in ground plane and lend themselves to a wide variety of applications commonly assigned U.S. Pat. Nos. 4,894,126 and 4,898,651 relate to anodized aluminum substrates which are useful in electronic packaging applications.

Because of the just noted advantages incident to the use of anodized aluminum substrates as printed circuit substrates, it is desirable to be able to directly attach electronic chips to an appropriately circuitized anodized aluminum substrate as this is a direction the industry is pursuing. When high count I/O chips are mounted on carrier substrates, concern arises about manufacturability, thermal management and long term reliability. These are considerations of particular concern when the directly attached device consumes high power.

It is known to use polymer coated metal carriers for receiving directly attached chips, where the attachment is made through wire bonding or similar attachment methods. Inherent problems associated with such a manufacturing process relate to adhesion and inadequate heat dissipation characteristics.

SUMMARY OF THE INVENTION

The present invention overcomes the problems associated with prior art techniques by providing a process including the use of a neutralized aqueous electroless plating bath composition for depositing a layer of nickel on a substrate for use in electronics packaging applications, particularly for direct chip attachment. The process of the present invention is unlike commercially used processes in that is not chemically agressive. Nor does it require high operating temperatures.

The invention may be used with anodized aluminum or other substrates which exhibit sensitivity to strong pH values. When used to plate anodized aluminum, the layer of anodic aluminum is first sensitized, preferably as disclosed in commonly assigned U.S. Pat. No. 4,431,707. Another method of sensitizing the substrate surface is by printing and curing conductive polymer thick films. Plating then follows. The substrate is electrolessly plated with nickel from a neutral aqueous bath containing nickel sulfate, sodium citrate, lactic acid, and dimethylborane.

The present invention allows versatility in technology by providing both high density and thermally conductive packages.

The bath chemistry is compatible with the anodic coating and it operates at temperatures slightly above room temperature. In addition to inherent energy savings, the low temperature plating process minimizes thermal shocks to anodized aluminum substrates, which shocks would be likely to introduce flaws.

DESCRIPTION OF THE PREFERRED EMBODIMENT

A preferred bath composition is:

| A preferred bath composition is | |
|---|---|
| nickel sulfate, | 30–40 g/l |
| sodium citrate, | 20–25 g/l |
| lactic acid, | 8–12 g/l |
| dimethylborane; | 20–25 g/l |
| deionized water, | 900 m/l |

In this composition, nickel sulfate is the source of nickel to be plated. Sodium citrate is a complexing agent. Lactic acid is used as a stabilizing agent. Dimethylborane is a reducing agent. Ammonium hydroxide is used to neutralize the mixture.

The bath is formulated by first measuring the appropriate volume of deionized water, then gradually adding the other bath components in the above listed sequence.

Finally, ammonium hydroxide is added to the bath until a pH of 7 is reached.

While the above noted bath composition is believed to be the best mode of carrying out the present invention, it has been found also that satisfactory results may be achieved when various component substitutions are made.

EDTA is a compatible material which may be substituted for sodium citrate. Similarly, glycolic, acetic or succinic acid may replace the lactic acid in the bath composition. Hydrazine may be used in place of dimethylborane.

The following examples are provided to enable a better appreciation of the present invention.

EXAMPLE 1

4 inch×4 inch coupons of anodized aluminum (50–76 microns) were plated in commercially available plating solutions which were either alkaline (pH 10–13) or acidic (pH 1–4). In both cases, there was a severe degradation at the anodic layer which resulted in poor adhesion of the electro deposited metal. Visual and surface analysis using scanning electron microscopy (SEM) of the plated coupons showed that the poor adhesion was due to cohesive failure of the anodic layer.

EXAMPLE 2

Several coupons of anodized aluminum of the same dimensions and thickness as in Example 1 were plated per this invention in the following solution:
Nickel sulfate, 30 grams
Sodium citrate, 20 grams
Lactic Acid, 8 grams
Dimethylborane, 20 grams
Deionized water, 900 ml Ammonium hyroxide was added to this solution until a pH 7 (neutral solution) was obtained. The solution was heated to 50 degrees centigrade. Subsequent tests of adhesion showed excellent results. There was no cohesive failure or debonding at the metal-anodic layer interface.

EXAMPLE 3

In another test, coupons were plated in the following bath:
Nickel sulfate, 40 grams
Sodium citrate, 25 grams
Lactic acid, 10 grams
dimethylborane, 25 grams
Deionized water, 900 grams.

Enough ammonium hydroxide was added to adjust the pH to 7. The solution was heated to 40 degrees centigrade, and the coupons were plated for 20 minutes. Subsequent adhesion testing again showed excellent results as in Example 2.

EXAMPLE 4

The same solutions as in examples 2 and 3 were used to plate anodized coupons. The only difference was that the temperature at which plating was carried out was room temperature (25 degrees centigrade). There was no plating observed at this temperature even after prolonged immersion time.

EXAMPLE 5

The operating temperature for the two formulations of Examples 2 and 3 wa raised to 70 degrees centigrade. There was a very fast deposition rate but the plated metal was coarse, making it unsuitable for wire bonding.

EXAMPLE 6

A solution as in Example 2 was used except instead of dimethyl borane, hydrazine was used. Again, adhesion testing showed excellent results with no cohesive or interface failures.

A suitable method for completing an electronic package utilizing the present invention is as follows. Circuitry patterns are additively provided in accordance with the teachings of commonly assigned concurrently filed, copending application Ser. No. 07/289,995, now abandoned.

Another suitable technique for direct chip attach includes first screening a conductive polymer thick film to a thickness of less than 10 microns on the anodic coating of an anodized aluminum substrate and then curing.

Plating is carried out in accordance with the above described process to obtain a nickel layer 20–25 microns thick on the polymer thick film. Conventional wire bonding operations may be used to join the plated nickel to a chip attached to the anodic layer of the substrate by means of a thermally conductive adhesive.

While the invention has been described having reference to a preferred embodiment and modifications thereto in the form of substitute plating bath components, those having skill in the art will appreciate that the above noted modifications and others may be made without departing from the spirit and scope of the invention as claimed.

I claim:

1. A method of plating an anodized aluminum substrate comprising:
    surface activating the substrate;
    immersing the substrate in an aqueous neutral bath composed of
        nickel sulfate in the range of from about 30 to about 40 grams per liter,
        sodium citrate in the range of from about 20 to about 25 grams per liter,
        lactic acid in the range of from about 8 to about 12 grams per liter,
        dimethylborane in the range of from about 20 to about 25 grams per liter,
        deionized water in the amount of from about 800 to about 900 milliliters,
        at a temperature of about 40 to about 50 degrees centigrade,
        for a period sufficient in duration for plating to a predetermined thickness.

2. The method of claim 1 wherein EDTA replaces sodium citrate in said aqueous neutral bath.

3. The method of claim 1 wherein said aqueous neutral bath, lactic acid, is replaced by glycolic, acetic or succinic acid.

4. The method of claim 1 wherein hydrazine replaces dimethylborane in said aqueous neutral bath.

5. The method of claims 1, 2, 3, or 4, wherein said aqueous neutral bath becomes neutral by the addition of ammonium hydroxide in the amount sufficient to yield a pH of 7.

* * * * *